(12) United States Patent
Gardner

(10) Patent No.: US 6,696,868 B1
(45) Date of Patent: Feb. 24, 2004

(54) FREQUENCY TO FREQUENCY DE-RANDOMIZER CIRCUIT

(75) Inventor: John Gardner, Reading (GB)

(73) Assignee: The Secretary of State for Defence in Her Britannic Majesty's Government of the United Kingdom of Great Britain and Northern Ireland, London (GB)

( * ) Notice: Subject to any disclaimer, the term of this patent is extended or adjusted under 35 U.S.C. 154(b) by 0 days.

(21) Appl. No.: 09/787,765
(22) PCT Filed: Sep. 17, 1999
(86) PCT No.: PCT/GB99/03094
§ 371 (c)(1), (2), (4) Date: Mar. 22, 2001
(87) PCT Pub. No.: WO00/21190
PCT Pub. Date: Apr. 13, 2000

(30) Foreign Application Priority Data

Oct. 2, 1998 (GB) .............................................. 9821361

(51) Int. Cl.$^7$ ............................................... H03D 3/00
(52) U.S. Cl. ..................... 327/102; 327/101; 327/164; 327/311
(58) Field of Search ............................... 327/102, 101, 327/103, 113, 310, 311, 552, 557, 558, 559, 164, 165

(56) References Cited

U.S. PATENT DOCUMENTS

| 3,579,127 | A | | 5/1971 | Thomas | 328/145 |
|---|---|---|---|---|---|
| 3,646,330 | A | | 2/1972 | Rudnick et al. | 235/150.3 |
| 3,943,448 | A | * | 3/1976 | Motley et al. | 325/321 |
| 4,608,954 | A | * | 9/1986 | Gray | 123/352 |
| 4,618,969 | A | | 10/1986 | Badono et al. | 377/49 |
| 4,642,466 | A | * | 2/1987 | Swansen | 250/392 |
| 4,825,077 | A | | 4/1989 | Tawil et al. | 250/369 |
| 4,872,209 | A | * | 10/1989 | Blanken | 330/294 |
| 4,947,133 | A | * | 8/1990 | Thomas | 327/318 |
| 5,132,543 | A | | 7/1992 | Valentine et al. | 250/388 |
| 5,663,675 | A | * | 9/1997 | O'Shaughnessy | 327/553 |
| 5,734,294 | A | * | 3/1998 | Bezzam et al. | 327/552 |
| 5,933,037 | A | * | 8/1999 | Momtaz | 327/157 |
| 6,369,393 | B1 | * | 4/2002 | Jordanov | 250/395 |

FOREIGN PATENT DOCUMENTS

| EP | 0 132 067 | 1/1985 |
|---|---|---|
| GB | 1 025 807 | 4/1963 |

OTHER PUBLICATIONS

H.J. Fraser, "A Portable Four–Decade Logarithmic G.M. Survey Meter" *Nuclear Instruments and Methods* 118 (1974) pp. 263–267.

* cited by examiner

Primary Examiner—Timothy P. Callahan
Assistant Examiner—Hai L. Nguyen
(74) Attorney, Agent, or Firm—Nixon & Vanderhye P.C.

(57) ABSTRACT

A frequency to frequency de-randomizer circuit having means for smoothing a current which comprises a diode filter configured so as to have a time constant which changes in response to changes in the current thus providing a rapidly responding, real time, fluctuation free signal which is optimised for measurement and display from a very low power circuit.

7 Claims, 1 Drawing Sheet

FREQUENCY TO FREQUENCY DE-RANDOMIZER CIRCUIT

This application is the U.S. national phase of International Application No. PCT/GB99/03094, filed Sep. 17, 1999, which designated the U.S., the entire content of which is hereby incorporated by reference.

BACKGROUND OF THE INVENTION

1. Field of the Invention

The present invention relates to an improved frequency to frequency de-randomizer circuit and in particular to a low power frequency to frequency de-randomizer circuit.

2. Discussion of Prior Art

Several types of technique are well known and commonly used in existing devices for de-randomizing an input signal to provide a useable output signal. On example described in U.S. Pat. No. 3,646,330 (Rudnick Stanley J et al) is concerned with a continuous digital ratemeter including de-randomizer. However the circuit of U.S. Pat. No. 646,330 is unable to adapt the time constant for smoothing the current depending upon the frequency of the incoming pulses. Further examples of such techniques include integrating counts over a period ("store a display average") and diode pump circuits or variants. Details of the later are contained in 'Electronics for Nuclear Particle Analysis'— Herbst, p223 to 225 and Radiation Detection and Measurement' ($2^{nd}$ Edition)—Knoll, p601 & 602. However, each of the known techniques has associated problems.

Modification of the display driver software code to achieve a fast responding, fast settling, accurate and steady display could have been used in the circuit according to the invention. However, the circuit according to the invention is designed for power efficiency and as such the processors operate at very low clock speeds to conserve power and the complexity of the software code has had to be minimised. Thus, if the display driver software code had been used, the processors would have to operate faster and the power consumption of the device would be higher.

The problem with 'store and display average' arrangements is that they are unable to function in real-time. To achieve a fast responding, fast settling, accurate and steady display, requires the use of a microprocessor running at high clock speeds. This could be fast enough to appear to be working in real time but would have high power consumption due to the processor speed. The circuit according to the invention is designed for power efficiency and as such the microprocessors operate at low speeds to conserve power and the software code is minimised. Hence, the power consumption implications associated with a microprocessor operating at high speed is unacceptable.

Finally, diode pump circuits work well at high frequencies. However, at low frequencies the time-constant required within the circuitry to give an acceptable or steady reading, causes the circuit to have a slow response. This is unacceptable in a device which needs to perform well at both high and low frequencies.

SUMMARY OF THE INVENTION

It is an aim of the present invention to provide a frequency-to-frequency de-randomizer circuit with reduced power consumption which can perform well at both high and low frequencies.

Accordingly the present invention provides a frequency to frequency de-randomizer circuit comprising means for converting the frequency of an input signal into an output current, means for smoothing the output current and means for converting the smoothed output current into an output signal having a frequency suitable for digital processing characterised in that the means for smoothing the output current comprises a diode filter configured so as to have a time constant which changes in response to changes in the output current.

The frequency-to-frequency de-randomizer circuit according to the invention is based on the same concept as the diode pump described above. However the invention utilises a logarithmic filter circuit to address the above frequency problem which is fed from a standard diode transistor pump which performs the frequency to current conversion required by the circuit.

Input to the frequency-to-frequency de-randomizer circuit is in the form of a randomly varying pulsed signal. This input is then fed into a linear frequency to current converter such as a diode transistor pump. Alternatively a diode pump or a transistor pump could be used however a diode transistor pump produces both linearity in response and simplicity in the circuit. The varying current output is in turn fed into a diode filter to smooth the current and obtain a time averaged, real time smoothed output. The diode filter can comprise any number of stages dependent on the filtering required. A three stage filter comprises three resistors in parallel with three diodes which each have an associated filter capacitor (a fourth filter capacitor can also be added to increase filtering if required), however as little as one diode acting as the resistive element and an associated filter capacitor can be used. The more stages used, the more filtering is performed however adding more stages provides a diminishing level of filtering. The inventor has found that the optimum balance between level of filtering and number of components is reached with three stages of filtering. Diode theory shows that the effective slope resistance of a forward biased diode is inversely proportional to the current flowing through it, such that for example at 1 mA the resistance is 25 $\Omega$ and at 10 mA it is 2.5 $\Omega$ and so on. As such, the use of diodes in the resistive elements of this filter serves the purpose of providing a moving time constant with respect to count rate (or current) producing longer time constants at low count rates (and therefore low currents) and shorter time constants at higher count rates (and therefore high currents) as the current through the diodes increases, thus allowing the device to perform well at both high and low counting rates, keeping the response speeds high at high count rates and the fluctuations due to randomness at low count rates to a minimum. At very low count rates the resistors will dominate providing a minimum response time.

The output from the filter can then be converted into an output signal at a frequency suitable for measurement and display. Such conversion can be accomplished by any known means, however, advantageously it can be accomplished by an operational amplifier feeding into a voltage controlled oscillator which produces the output signal and a second means for converting the frequency of an input signal into an output current which converts the output signal into a balancing current, the balancing current then being used to balance the input into the operational amplifier.

The use of an operational amplifier/voltage controlled oscillator arrangement maintains the output of the filter at virtual earth (or other nominal voltage as required). This prevents a build up of charge at the output of the filter, an effect which would slow the response of the circuit.

The second frequency to current converter can be of any form as with the first frequency to current converter, however advantageously it can be in the form of a diode transistor pump. This diode transistor pump acts as a linear frequency to current converter.

This circuit provides a rapidly responding, real time, fluctuation free signal which is optimised for measurement and display from a very low power circuit.

The frequency-to-frequency de-randomizer circuit according to this invention can be used in any application requiring de-randomization of an input however the circuit according to the present invention has been optimised for use in a radiation monitor. In particular it has been optimised for use in a portable radiation monitor which requires to meet the BASEEFA criteria and which needs no on/off switch, the power efficiency of the circuits resulting in the batteries only requiring replacement annually during planned preventative maintenance and calibration activities, as required under the Ionising Radiation Regulations, 1985.

In a radiation monitor, this circuit performs the function of taking randomly occurring α/β pulses from two discriminators and converting this to a relatively fluctuation free square wave output stream suitable for input into a microcontroller system to provide a display. Two identical circuits are employed in the monitor, one each for the α and β signals.

BRIEF DESCRIPTION OF THE DRAWINGS

Embodiments of the invention will now be described, by way of example, with reference to the accompanying drawing, wherein.

DETAILED DISCUSSION OF EMBODIMENTS

Figure 1:
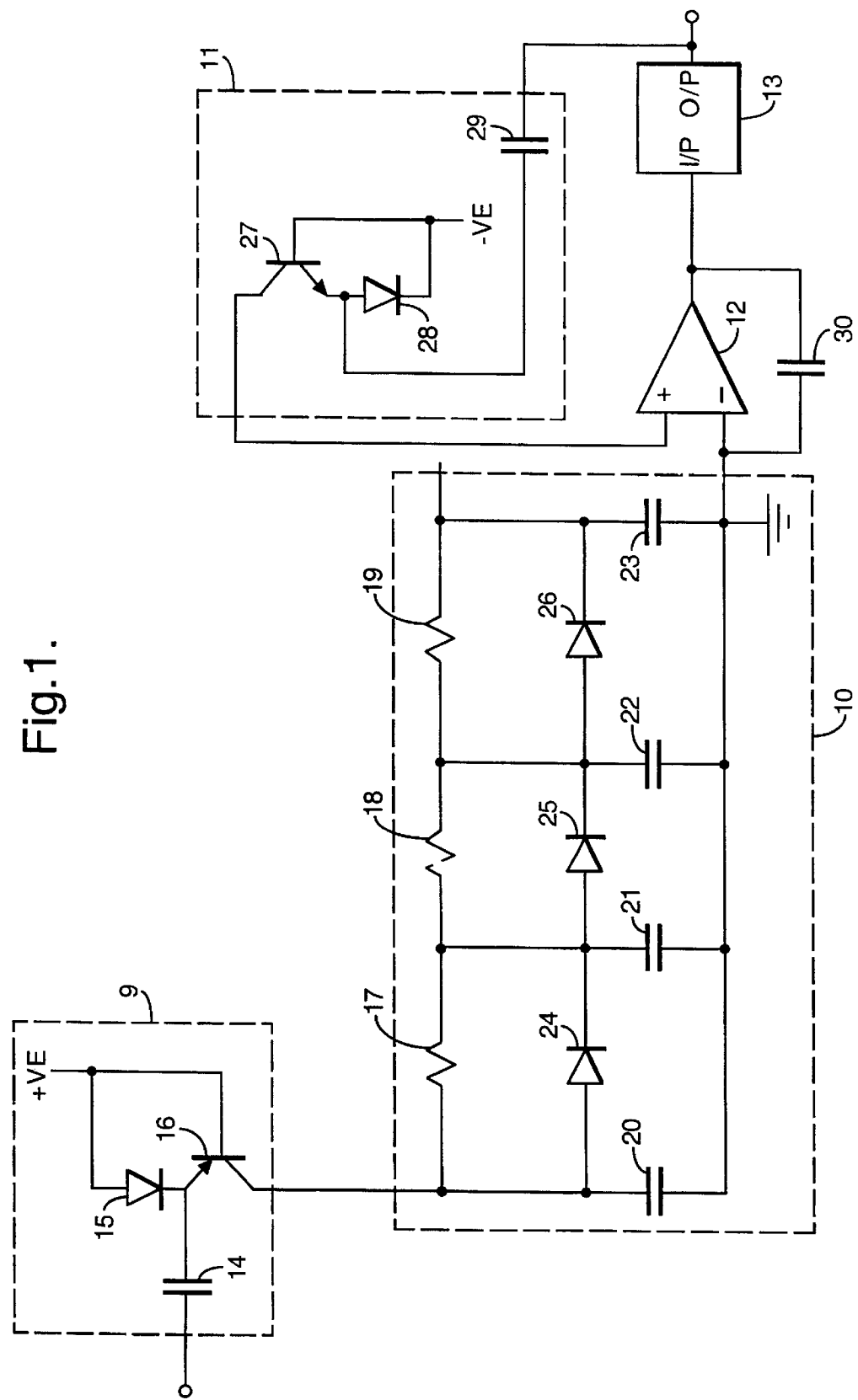
FIG. 1 shows a circuit diagram of the frequency-to-frequency de-randomizer circuit.

Referring to FIG. 1, the frequency-to-frequency de-randomizer circuit comprises a first and second diode transistor pump 9, 11 a 3 stage filter 10, an operational amplifier 12 with associated control capacitor 30 and a voltage controlled oscillator 13. The diode transistor pumps 9, 11 consist of a capacitor 14, 29, a diode 15, 28 and a transistor 16, 27. The 3 stage filter 10 consists of 3 resistors 17, 18 and 19 arranged in parallel with 3 diodes 24, 25 and 26 with 4 associated filter capacitors 20, 21, 22 and 23.

The input signal is fed into the first diode transistor pump 9 which functions as a linear frequency to current converter and converts the randomly occurring input signal into a varying current output, the output is then fed into the 3 stage filter 10 which serves the requirement of providing a longer time constant at low count rates and a smaller time constant at high count rates as the current through the diode increases. The output from the filter 10 is then fed into an operational amplifier 12 which is used in conjunction with a voltage controlled oscillator 13 in order to convert the output of the filter into a frequency ideally suited to measurement by the detector.

In order to balance the output current from the filter 10 the output from the voltage controlled oscillator 13 is fed, via the diode transistor pump 11, back into the operational amplifier 12 thus forming a feedback loop equalising the inputs of the operational amplifier 12. The two diode transistor pumps 9, 11 can be set such that the ratio of input to output pulses is 1 to 10. As the VCO and the second diode transistor pump are in the feedback loop of the operational amplifier then for every input pulse there must be 10 output pulses in order to balance the circuit. This ratio can of course be set to any value as required by specific applications.

What is claimed is:

1. A frequency to frequency de-randomizer circuit comprising:
   means for converting the frequency of an input signal into an output current,
   means for smoothing the output current and means for converting the smoothed output current into an output signal having a frequency suitable for digital processing, the means for smoothing the output current comprises a diode filter configured so as to have a time constant which changes in response to changes in the output current, wherein said diode filter comprises:
   three diodes,
   one resistor in parallel with each of said three diodes and
   an associated filter capacitor for each of said three diodes.

2. A frequency to frequency de-randomizer circuit according to claim 1 wherein the means for converting the frequency comprises a diode transistor pump.

3. A frequency to frequency de-randomizer circuit comprising:
   means for converting the frequency of an input signal into an output current,
   means for smoothing the output current and means for converting the smoothed output current into an output signal having a frequency suitable for digital processing, the means for smoothing the output current comprises a diode filter configured so as to have a time constant which changes in response to changes in the output current, wherein said diode filter comprises:
   three diodes,
   three resistors, each of said resistors in parallel with one of said three diodes, and
   three associated filter capacitors, each capacitor connected to a respective diode and resistor pair.

4. A frequency to frequency de-randomizer circuit comprising:
   means for converting the frequency of an input signal into an output current,
   means for smoothing the output current and means for converting the smoothed output current into an output signal having a frequency suitable for digital processing, the means for smoothing the output current comprises a diode filter configured so as to have a time constant which changes in response to changes in the output current, wherein said diode filter comprises:
   at least one diode,
   at least one resistor in parallel with said diode and
   an associated filter capacitor, wherein the means for converting the smoothed output current comprises an operational amplifier feeding into a voltage controlled oscillator which produces the output signal and a second means for converting the frequency of an input signal into an output current wherein the second means for converting the frequency of an input signal into an output current converts the output signal into a balancing current, the balancing current then being used to balance the input into the operational amplifier.

5. A frequency to frequency de-randomizer circuit comprising:
   means for converting the frequency of an input signal into an output current;
   means for smoothing the output current and means for converting the smoothed output current into an output signal having a frequency suitable for digital processing, the means for smoothing the output current comprises a diode filter configured so as to have a time constant which changes in response to changes in the output current, wherein sad diode filter comprises:
at least one diode,
at least one resistor in parallel with said diode and an associated filter capacitor, wherein the means for converting the smoothed output current comprises an operational amplifier feeding into a voltage controlled oscillator which produces the output signal and a second means for converting the frequency of an input signal into an output current wherein the second means for converting the frequency of an input signal into an output current converts the output signal into a balancing current, the balancing current then being used to balance the input into the operational amplifier.

6. A radiation monitor comprising a frequency to frequency de-randomizer circuit comprising:

means for converting the frequency of an input signal into an output current, means for smoothing the output current and means for converting the smoothed output current into an output signal having a frequency suitable for digital processing, the means for smoothing the output current comprises a diode filter configured so as to have a time constant which changes in response to changes in the output current, wherein said diode filter comprises:
at least three diodes,
at least one resistor in parallel with each of said at least three diodes and
an associated filter capacitor for each of said at least three diodes.

7. A radiation monitor according to claim 6, wherein said monitor comprises a portable radiation monitor.

\* \* \* \* \*